United States Patent
Fan et al.

(10) Patent No.: US 8,668,283 B2
(45) Date of Patent: Mar. 11, 2014

(54) ELECTRONIC DEVICE ENCLOSURE ASSEMBLY

(75) Inventors: Chen-Lu Fan, New Taipei (TW);
Li-Ping Chen, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 59 days.

(21) Appl. No.: 13/363,440

(22) Filed: Feb. 1, 2012

(65) Prior Publication Data

US 2012/0229007 A1    Sep. 13, 2012

(30) Foreign Application Priority Data

Mar. 11, 2011    (CN) .......................... 2011 1 0058463

(51) Int. Cl.
*A47B 87/00*    (2006.01)

(52) U.S. Cl.
USPC ........................ 312/198; 312/111; 312/223.1

(58) Field of Classification Search
USPC ........ 312/111, 198, 257.1, 223.1, 107.5, 107; 403/397
See application file for complete search history.

(56) References Cited

U.S. PATENT DOCUMENTS

| | | | | |
|---|---|---|---|---|
| 2,790,691 | A * | 4/1957 | Goebel | 312/111 |
| 3,748,006 | A * | 7/1973 | Levit et al. | 312/111 |
| 4,844,565 | A * | 7/1989 | Brafford et al. | 312/107.5 |
| 5,938,302 | A * | 8/1999 | Anderson et al. | 312/223.1 |
| 6,312,068 | B1 * | 11/2001 | Benner et al. | 312/111 |
| 6,678,161 | B1 * | 1/2004 | Claprood et al. | 361/724 |
| 6,724,636 | B2 * | 4/2004 | Yamamoto et al. | 361/747 |
| 6,732,858 | B1 * | 5/2004 | Chang Ou | 206/278 |
| 6,955,410 | B1 * | 10/2005 | Nelson et al. | 312/352 |
| 7,413,371 | B2 * | 8/2008 | Arnold et al. | 403/353 |
| 8,123,186 | B2 * | 2/2012 | Barringer et al. | 248/300 |
| 2013/0015749 | A1 * | 1/2013 | Hecht et al. | 312/111 |

* cited by examiner

*Primary Examiner* — Daniel Rohrhoff
(74) *Attorney, Agent, or Firm* — Altis Law Group, Inc.

(57) ABSTRACT

An electronic device enclosure assembly with a connecting assembly is disclosed. The electronic device enclosure assembly includes two electronic device enclosures. Each of the two electronic device enclosures includes a top frame, a bottom frame, a plurality of supports and a maintaining pole. The plurality of supports connects the top frame and the bottom frame, the maintaining pole is secured between two of the plurality of supports, and the maintaining pole defines a securing slot. A mounting member includes two side plates opposite to each other, and a positioning member protrudes from each of the two side plates. The maintaining poles of the two electronic device enclosures are located between the two side plates, the positioning member is engaged in the securing slot, and the two electronic device enclosures are connected together by the mounting member.

20 Claims, 4 Drawing Sheets

ELECTRONIC DEVICE ENCLOSURE ASSEMBLY

BACKGROUND

1. Technical Field

The present disclosure relates to electronic device enclosure assemblies, and particularly to an electronic device enclosure assembly with a connecting assembly.

2. Description of Related Art

A server cabinet may comprise a plurality of electronic systems, such as a power system, a control system and an exchange system. When a plurality of server cabinets is used or transported, and no connecting assemblies are provided, the plurality of server cabinets may be disorderly placed and may occupy a lot of space. Furthermore, the plurality of server cabinets may be easily damaged during usage or transportation.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
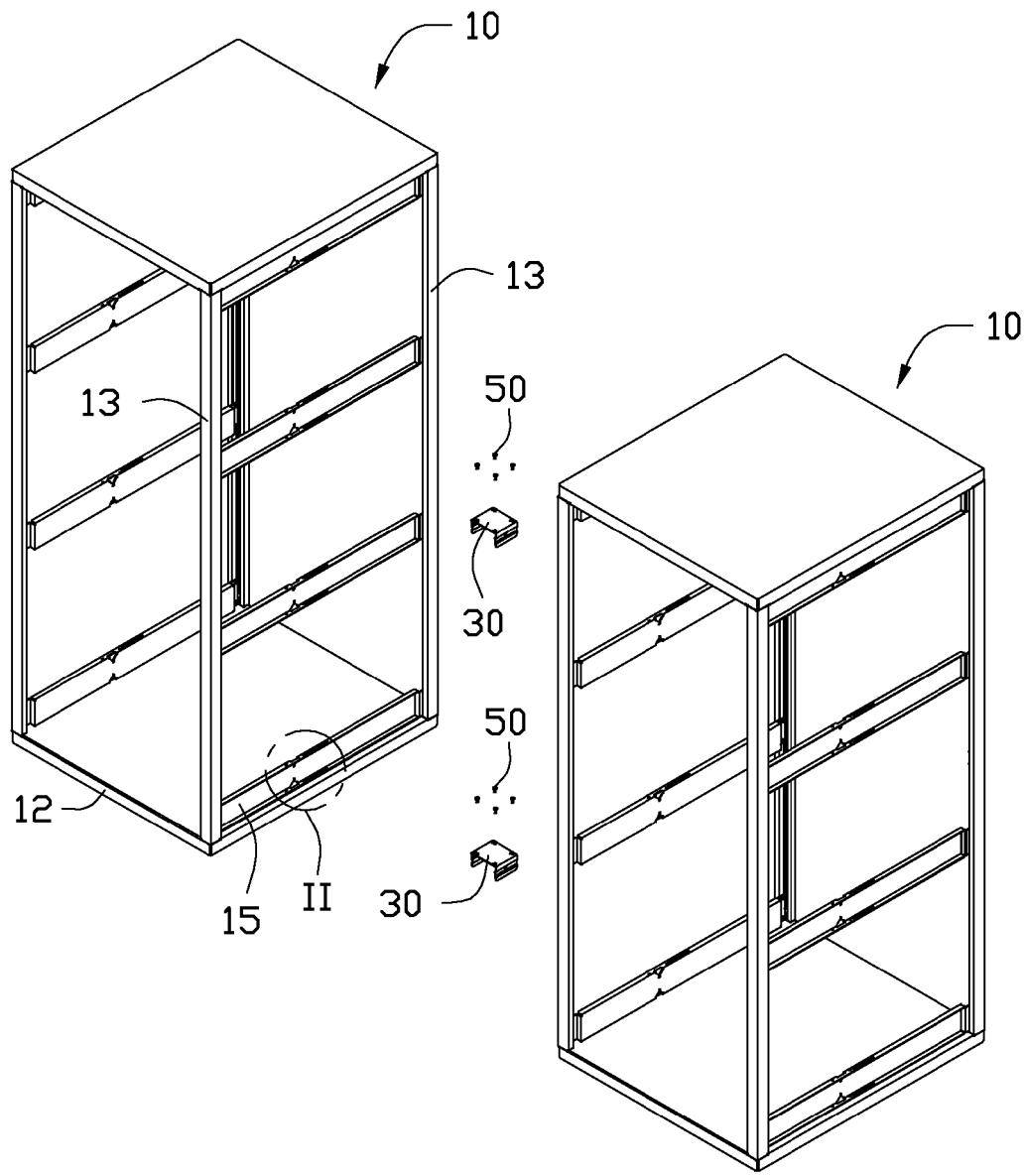
FIG. 1 is an exploded, isometric view of an embodiment of an electronic device enclosure assembly.

Referring to FIG. 1, an electronic device enclosure assembly comprises at least two electronic device enclosures 10 and two mounting members 30.

Figure 2:
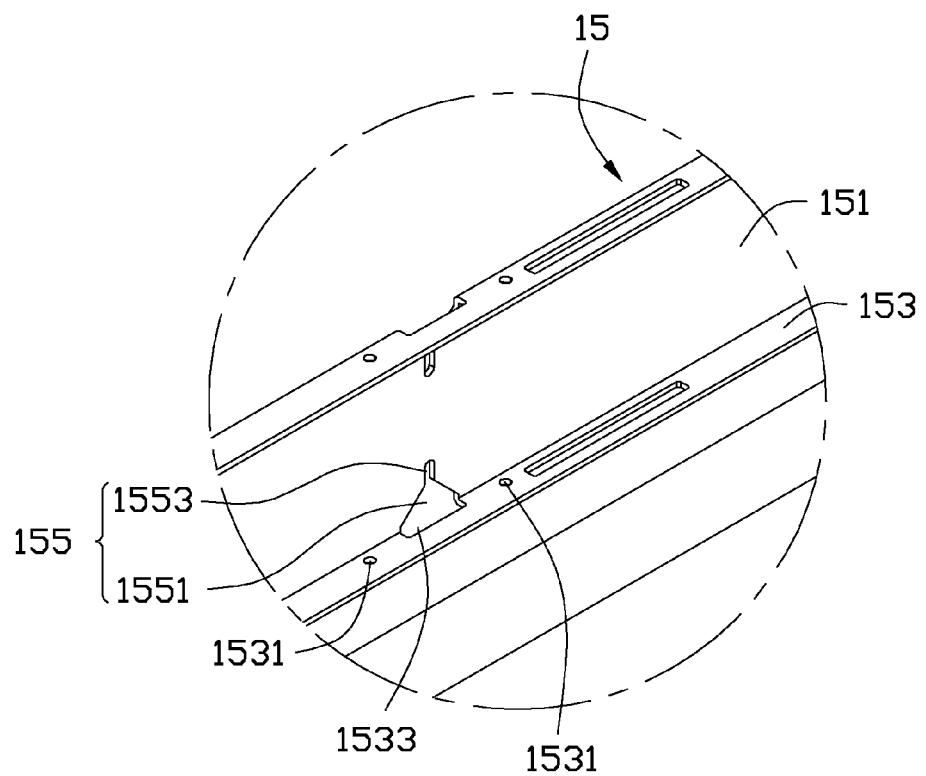
FIG. 2 is an enlarged view of a circled portion II of FIG. 1.

Referring to FIG. 2, each of the at least two electronic device enclosures 10 comprises a top frame 11, a bottom frame 12 and four supports 13. The top frame 11 is substantially parallel to the bottom frame 12. Each of the four supports 13 is secured in a corner of the top frame 11 and the bottom frame 12. A plurality of maintaining poles 15 is connected between two of the four supports 13. Each of the plurality of maintaining poles 15 comprises a body 151 and two flanges 153 extending from two opposite edges of the body 151. Each of the two flanges 153 defines two mounting holes 1531 and an opening 1533. The opening 1533 is located between the two mounting holes 1531. The body 151 defines two securing slots 155 corresponding to two of the openings 1533. Each of the two securing slots 155 comprises an inserting portion 1551 and a latching portion 1553. In one embodiment, each of the two securing slots 155 is funnel shaped. A width of the inserting portion 1551 is larger than that of the latching portion 1553. The inserting portion 1551 communicates with the opening 1533.

Figure 3:
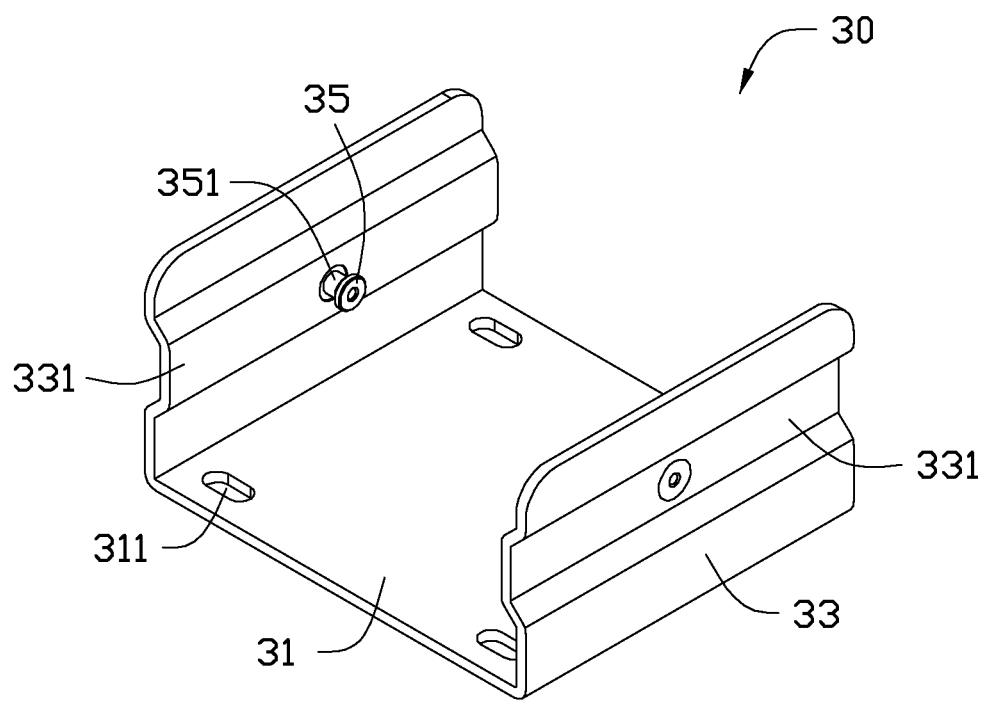
FIG. 3 is an isometric view of a mounting member of the electronic device enclosure assembly of FIG. 1.

Referring to FIG. 3, each of the two mounting members 30 comprises a bottom plate 31 and two side plates 33 opposite to each other. The bottom plate 31 connects the two side plates 33. In one embodiment, the bottom plate 31 is rectangular. The bottom plate 31 is substantially perpendicular to the two side plates 33. A positioning hole 311 is defined in each corner of the bottom plate 31. One of the two side plates 33 comprises a recess portion 331 extending towards another one of the two side plates 33. A positioning member 35 protrudes from the recess portion 331 and is located between the two side plates 33. The positioning member 35 defines a positioning slot 351.

Figure 4:
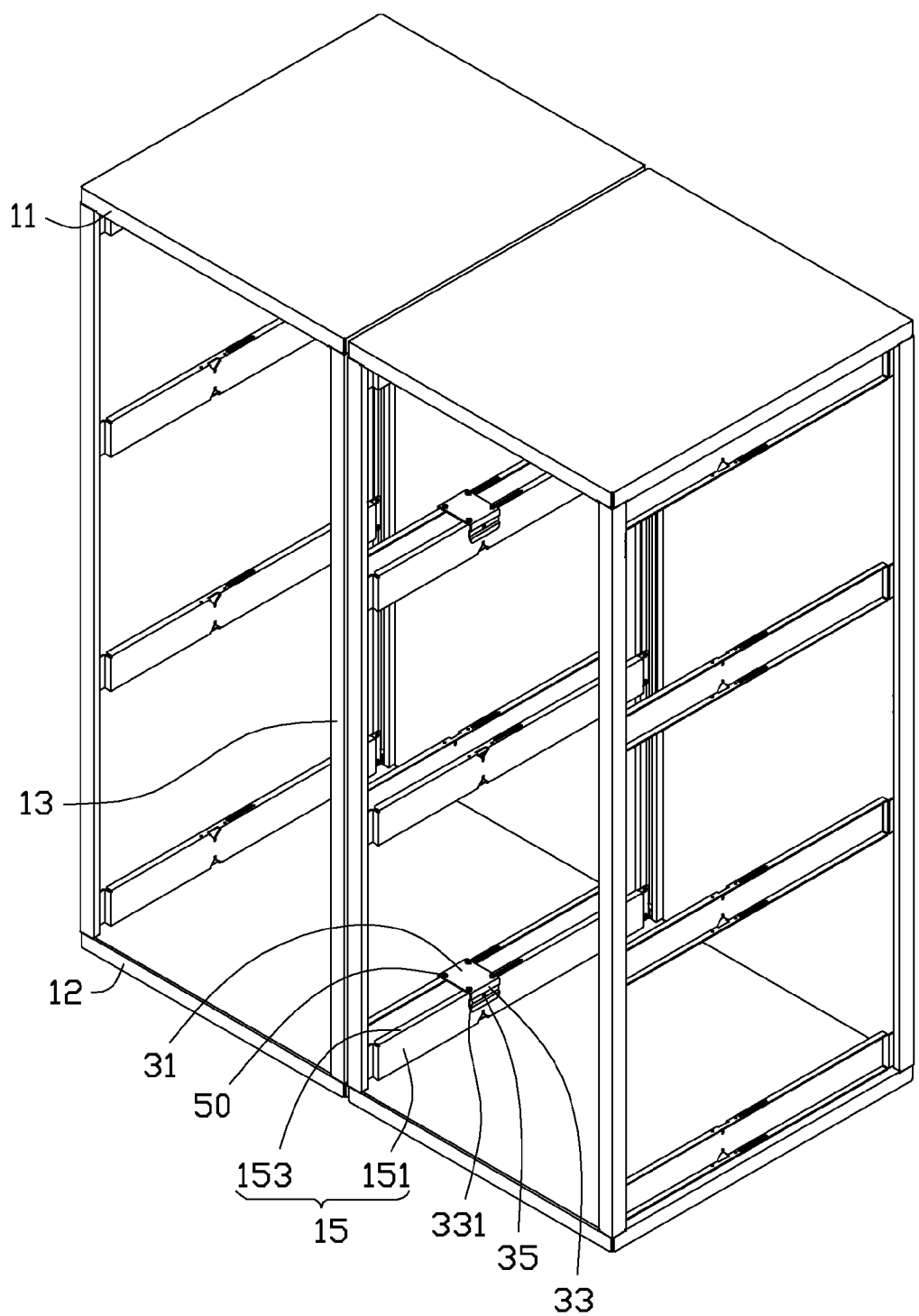
FIG. 4 is an assembled, isometric view of the electronic device enclosure assembly of FIG. 1.

Referring to FIG. 4, in use, the at least two electronic device enclosures 10 are placed together, and the plurality of maintaining poles 15 of one of the at least two electronic device enclosures 10 are substantially parallel to and adjacent to the plurality of maintaining poles 15 of another one of the at least two electronic device enclosures 10. Each of the two mounting members 30 is moved above adjacent two of the plurality of maintaining poles 15 of the at least two electronic device enclosures 10, and the positioning member 35 is aligned with each of the two securing slots 155. Each of the two mounting members 30 is moved towards the adjacent two of the plurality of maintaining holes 15. The positioning member 35 is inserted into the opening 1533 and slid along the inserting portion 1551 until the positioning member 35 is engaged with the latching portion 1553. The body 151 is engaged in the positioning slot 351. The bottom plate 31 abuts each of the two flanges 153, and the positioning hole 311 is aligned with each of the two mounting holes 1531. A plurality of locking members 90, such as screws, is locked into the positioning hole 311 and each of the two mounting holes 1531, and then each of the two mounting members 30 is secured to the adjacent two maintaining poles 15. The at least two electronic device enclosures 10 are connected together by each of the two mounting members 30.

To disassemble the electronic device enclosure assembly, the plurality of locking members 50 are removed from each of the two mounting members 30. Each of the two mounting members 30 is moved upwards to disengage the positioning member from the latching portion 1553. The at least two electronic device enclosures 10 can be apart from each other.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure assembly comprising:

two electronic device enclosures, and each of the two electronic device enclosures comprising a top frame, a bottom frame, a plurality of supports and a maintaining pole; the plurality of supports connecting the top frame and the bottom frame, the maintaining pole being secured between two of the plurality of supports, and the maintaining pole defining a securing slot; and a mounting member comprising two side plates opposite to each other, each side plate comprising a recess portion, and a positioning member protruding from the recess portion;

wherein the maintaining poles of the two electronic device enclosures are located between the two side plates, the positioning member is engaged in the securing slot, and the two electronic device enclosures are connected together by the mounting member.

2. The electronic device enclosure assembly of claim 1, wherein the maintaining pole comprises a body and a flange extending from the body, the flange is substantially perpendicular to the body, and the securing slot is defined in the body.

3. The electronic device enclosure assembly of claim 2, wherein the flange defines an opening, the positioning member is engaged in the securing slot through the opening.

4. The electronic device enclosure assembly of claim 3, wherein the securing slot comprises an inserting portion and a latching portion, the inserting portion communicates with the opening, and the positioning member is engaged with the latching portion.

5. The electronic device enclosure assembly of claim 3, wherein the mounting member further comprises a bottom plate, the two side plates extend from two opposite edges of the bottom plate; the bottom plate abuts the flange, and the recess portion abuts the body.

6. The electronic device enclosure assembly of claim 5, wherein the bottom plate defines two positioning holes, the flange defines two mounting holes, and two locking members, each of the two locking member is locked into each of the two positioning holes and each of the two mounting holes to secure the mounting member to the maintaining pole.

7. The electronic device enclosure assembly of claim 6, wherein the opening is located between the two mounting holes.

8. The electronic device enclosure assembly of claim 1, wherein the recess portion is located between the two side plates.

9. The electronic device enclosure assembly of claim 1, wherein the positioning member protrudes from the recess portion and defines a positioning slot, and the maintaining pole is engaged in the positioning slot.

10. The electronic device enclosure assembly of claim 1, wherein the positioning members of the two side plates protrude from two opposite directions, and each direction is substantially perpendicular to the two side plates.

11. An electronic device enclosure assembly comprising:
two electronic device enclosures, and each electronic device enclosure comprising a top frame, a bottom frame, a plurality of supports and a maintaining pole; the plurality of supports connecting the top frame and the bottom frame, the maintaining pole being secured between two of the plurality of supports, and the maintaining pole defining a securing slot; and
a mounting member comprising two side plates opposite to each other, a positioning member protruding from each of the two side plates, and the positioning member defining a positioning slot;
wherein the maintaining poles of the two electronic device enclosures are located between the two side plates, the securing slot comprising an inserting portion and a latching portion, and the positioning member being engaged with the latching portion; and the maintaining pole is engaged in the positioning slot, and the two electronic device enclosures being connected together by the mounting member.

12. The electronic device enclosure assembly of claim 11, wherein the maintaining pole comprises a body and a flange extending from the body, the flange is substantially perpendicular to the body, and the securing slot is defined in the body.

13. The electronic device enclosure assembly of claim 12, wherein the flange defines an opening, the positioning member is engaged in the securing slot through the opening.

14. The electronic device enclosure assembly of claim 13, wherein the inserting portion communicates with the opening.

15. The electronic device enclosure assembly of claim 13, wherein the mounting member further comprises a bottom plate, the two side plates extend from two opposite edges of the bottom plate, and each of the two side plates comprise a recess portion; the bottom plate abuts the flange, and the recess portion abuts the body.

16. The electronic device enclosure assembly of claim 15, wherein the recess portion is located between the two side plates.

17. The electronic device enclosure assembly of claim 15, wherein the positioning member protrudes from the recess portion, and the body is engaged in the positioning slot.

18. The electronic device enclosure assembly of claim 15, wherein the bottom plate defines two positioning holes, the flange defines two mounting holes, and two locking members, each of the two locking members is locked into each of the two positioning holes and each of the two mounting holes to secure the mounting member to the maintaining pole.

19. The electronic device enclosure assembly of claim 18, wherein the opening is located between the two mounting holes.

20. The electronic device enclosure assembly of claim 11, wherein the securing slot is funnel shaped.

* * * * *